(12) United States Patent
Ball

(10) Patent No.: US 7,302,752 B2
(45) Date of Patent: Dec. 4, 2007

(54) METHOD OF MANUFACTURING AN EXTENDED TEST SWITCH

(75) Inventor: Roy Ball, Coral Springs, FL (US)

(73) Assignee: ABB Inc., Norwalk, CT (US)

( * ) Notice: Subject to any disclaimer, the term of this patent is extended or adjusted under 35 U.S.C. 154(b) by 416 days.

(21) Appl. No.: 10/947,758

(22) Filed: Sep. 23, 2004

(65) Prior Publication Data
US 2006/0059681 A1    Mar. 23, 2006

(51) Int. Cl.
*H01H 11/00* (2006.01)
*H01H 65/00* (2006.01)
(52) U.S. Cl. .............................. 29/622; 29/593; 29/842; 307/64; 324/141; 324/142; 324/754; 361/724; 361/727
(58) Field of Classification Search .................. 29/622, 29/593, 842; 307/64; 324/141, 142, 754; 361/724, 727
See application file for complete search history.

(56) References Cited

U.S. PATENT DOCUMENTS 4,423,336 A * 12/1983 Iverson et al. ................. 307/64
4,615,009 A *  9/1986 Battocletti et al. ............ 702/60

* cited by examiner

*Primary Examiner*—A. Dexter Tugbang
*Assistant Examiner*—Tim Phan
(74) *Attorney, Agent, or Firm*—Paul R. Katterle; Michael M. Rickin

(57) ABSTRACT

A method of making and using an extended test switch starting with a previously existing un-extended test switch that is ready for connection to electrical devices to be tested. A housing selected from one or more available housings each having a predetermined length is connected to a modified un-extended test switch. Each housing has a rear wall that has several inwardly and outwardly facing terminals. At least one of the rear facing terminals of the un-extended test switch is connected to an associated one of the inwardly facing terminals of the housing. After manufacture the extended test switch can be mounted in a suitable receptacle for connection to at least one electrical device. One or more of the switches on the front of the un-extended test switch to be left in an operational condition with a clear cover attached to the front of the test switch.

9 Claims, 9 Drawing Sheets

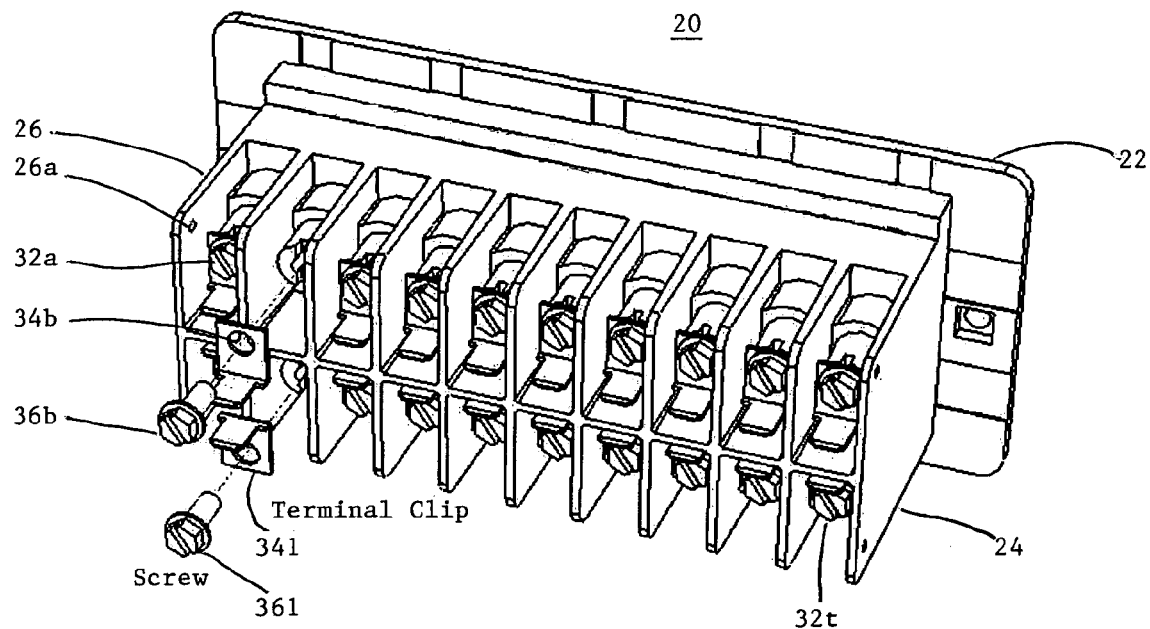
FIG 4a
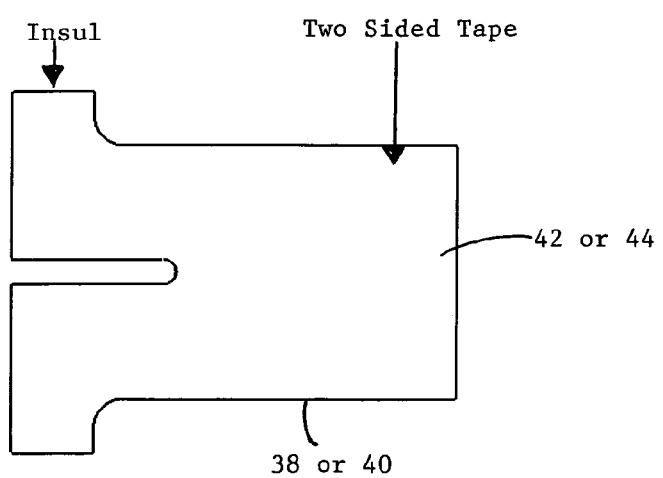

METHOD OF MANUFACTURING AN EXTENDED TEST SWITCH

FIELD OF THE INVENTION

This invention relates to test switches.

DESCRIPTION OF THE PRIOR ART

Relays are commonly used in electric utility applications to detect various possible problems in the electrical power output and thus protect very expensive equipment such as motors and generators. These protective relays are used in relay systems which also include circuit breakers. Relays and circuit breakers must function together because the primary function of the relays is to trip the circuit breakers.

Protective relays constantly monitor the power systems to assure maximum continuity of electrical service with minimum damage to life and property. Thus, they are on guard throughout—from the generation, through transmission, into distribution and utilization.

The protective relays are found in large and small systems, in the power companies and in industries that use electrical power. This wide usage along with a requirement for reliable operation, has in the past created a heavy demand for relay products that will continue into the future. Relaying has a high potential for significant change as new technology and tools have their impact. Some examples of new technology and tools are the remote tripping relays using satellite technology or very sophisticated computerized relays that use fiber optics and software programs to detect, monitor and arm protective relay systems from remote areas. The new technology allows the customer to save important tripping data that is needed for various reasons such as for example determining the cause, when, why and where a problem occurred. The prior art electromechanical relays do not have most of these features and while they will provide the same basic information they rely mainly on an indication target.

Today some of the new technologies and tools have changed the design of the protective relays but not their application. Some of today's protection applications are without limitation: motor, generator, transformer, station-bus, line and circuit, system ground, network systems, pilot wire, pilot channel, transmission line, pilot relying, backup, reclosing, synchronizing, load-shedding, frequency and many more. In general, current transformers and potential transformers are employed in high current and high potential applications.

The transformers reduce the magnitude of the current or voltage, which is then fed to the relays, meters and instruments at a much lower level for detection. The relay terminals are then connected to a test switch terminal or poles. Each test switch can be associated with one or more relays. It is absolutely necessary to short circuit the line and load terminals when the relay is removed from its case or the adjacent test switch is opened. The test switch provides this necessary short circuit or bypass feature. If this short circuit does not occur there could be significant damage to the associated current transformer as well as a safety hazard to nearby personnel.

One example of such a prior art test switch is the Flexitest™ test switch 10 shown in FIG. 1a which is sold by ABB Inc. of Coral Springs, Fla., the assignee of the present invention. The variety and extensive types of test switches available allows for many types of applications. As is well known to those of ordinary skill in the art these applications include but are not limited to a test switch with all potential switches, that is, no switches associated with current transformers, or all of the switches in a test switch associated with current transformers.

Test switch 10 includes on its front face 10 switches 12a to 12j arranged in five (5) sets. In the embodiment shown in FIG. 1a for prior art test switch 10 there are three (3) sets of switches, namely 12a and 12b, 12c and 12d, and 12e and 12f which are associated with a respective one of three (3) current transformers (not shown). As is well known, each current transformer is associated with a respective one of the three (3) phases of a three phase power source. Test switch 10 also includes four potential switches 12g, 12h, 12i and 12j with one of the four switches associated with phase A of the three phase source, a second of the four switches associated with phase B of the three phase source, a third of the four switches associated with phase C of the three phase source and the fourth switch associated with the neutral of the three phase power source.

One example of the three sets of switches associated with a current transformer are shown in FIG. 1b. The two switches in each of the three sets of switches associated with a current transformer include a switch such as switch 12a, 12c or 12e which has a shorting blade 14 and a switch such as switch 12b, 12d or 12f which does not have a shorting blade. The switch 12a, 12c or 12e with the shorting blade provides when opened the desired short circuit of the line and and load terminals when that switch is opened. The switch 12b, 12d or 12f without the shorting blade provides a current test jack 16.

Test switch 10 also includes on it rear face twenty terminals only ten of which 18a to 18j are shown in FIG. 2a for connection to the relays associated with the current transformers and the three phases and neutral of the three phase source. When test switch 10 is mounted in a switchboard panel (not shown) the switches 12a to 12j are accessible from the front of the panel and the terminals 18a to 18j and the other ten rear face terminals not shown in FIG. 2a are accessible from the rear of the panel.

However, while such prior art test switches have proven to be an effective means of implementing connections to all types of relays, meters and instruments, such switches are not without their drawbacks. Typically these test switches are mounted on switchboard panels along with various other equipment, such as relays, meters, and instruments. Until recently most such equipment were short in length, so that the test switches of the prior art would be long enough to provide easily accessible wiring to the connectors on the test switch rear terminals. However, as technology has evolved and more high technology equipment entered, the equipment has gotten bigger and longer horizontally, thus projecting further into the switchboard panel.

Mounting the prior art test switch in a panel between two longer type equipments may give rise to some difficulty in connecting the wires to the rear of that test switch and may expose the technician to a safety hazard. The test switch of the present invention overcomes these problems.

SUMMARY OF THE INVENTION

A method of manufacturing an extended test switch. The method comprises:

providing a previously existing un-extended test switch that is ready for connection to electrical devices to be tested, the un-extended test switch comprising a front face having a predetermined number of switches and a rear face having a predetermined number of terminals for receiving connection wires;

selecting a housing from one or more available housings, each of the housings having a different predetermined length and comprising a rear wall having a predetermined number of inwardly facing and outwardly facing terminals;

modifying the un-extended test switch to accept any one of the available housings;

connecting a selected one of the rear face terminals of the un-extended test switch to a selected one of the predetermined number of the inwardly facing terminals of the selected housing rear wall; and connecting the selected housing to the un-extended test switch.

A method of using an extended test switch. The extended test switch has a front face with a predetermined number of switches and a rear face with outwardly facing terminals. The method comprises:

mounting the extended test switch in a receptacle that allows electrical devices to be connected to the outwardly facing terminals; and attaching a translucent cover to the front face of the extended test switch even when one or more of the switches are left in an actuated position.

DESCRIPTION OF THE DRAWING

FIG. 3 shows the changes made to the terminals on the rear of the modified test switch.

FIGS. 4a and 4b shows that attachment of the insulation to the modified test switch.

DESCRIPTION OF THE PREFERRED EMBODIMENT(S)

Figure 1A:
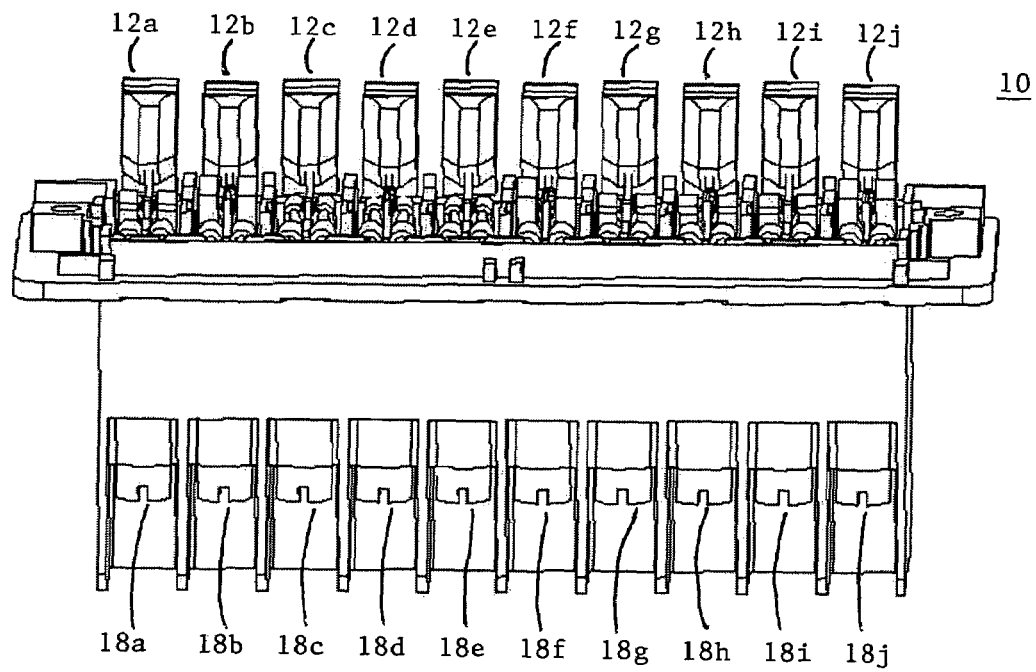
FIG. 1a shows a prior art test switch.
Figure 1B:
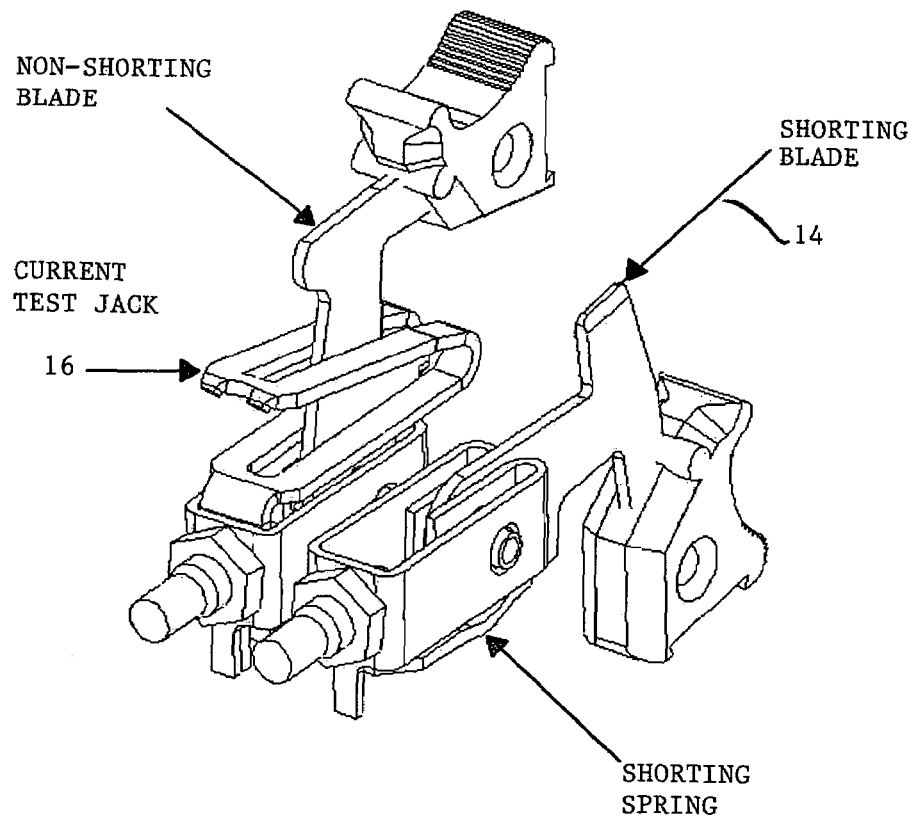
FIG. 1b shows an example of a set of switches in the prior art test switch that is associated with a current transformer.
Figure 2A:
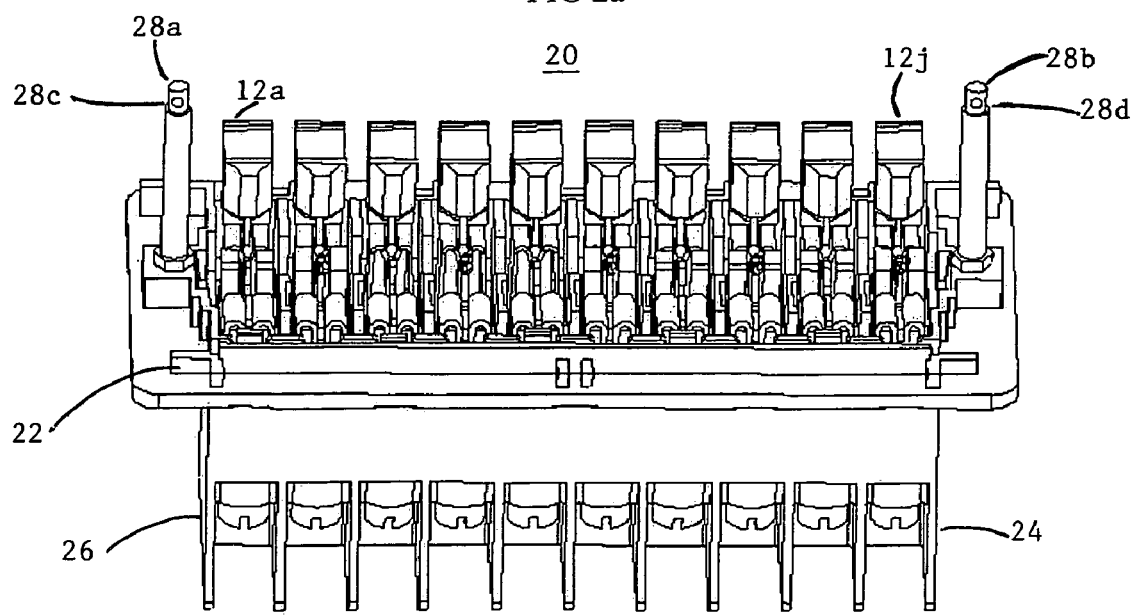
FIGS. 2a and 2b show the prior art test switch modified so that it can be used as the basis for the test switch of the present invention.
Figure 2B:
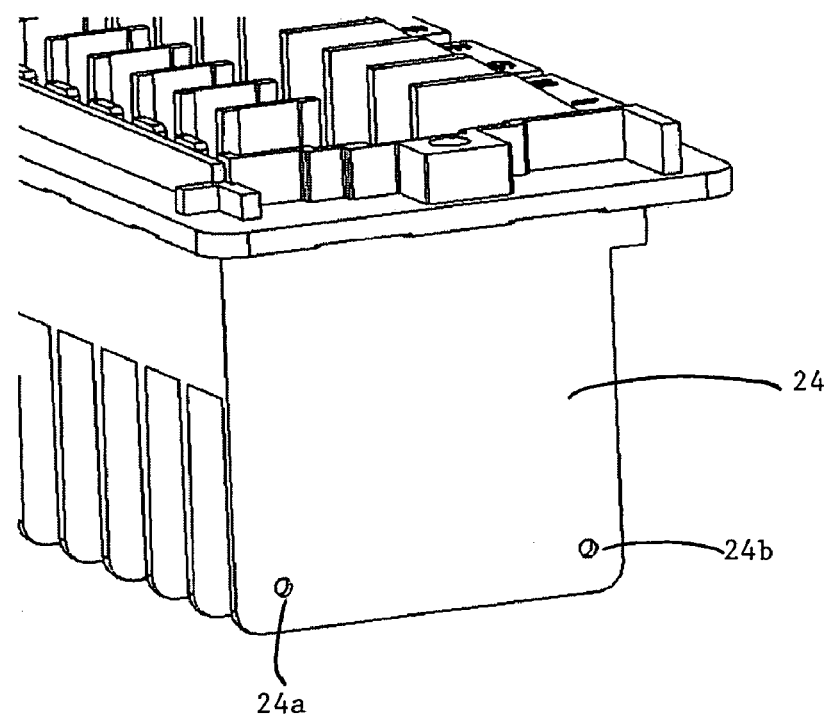

Referring now to FIGS. 2a and 2b there is shown the test switch 10 of FIG. 1 modified so that it can be used as the basis for the test switch of the present invention. As is shown in FIG. 2b the modified test switch 20 has two holes 24a and 24b on rearwardly extending side 24 of base 22. While not shown in FIG. 2b, rearwardly extending side 26 of base 22 (see FIG. 2a) which is parallel to rearwardly extending side 24 also has two holes which correspond to holes 24a and 24b. Modified test switch 20 also has two studs 28a and 28b for mounting the test switch in a switchboard panel and for attaching to the front of modified test switch 20 the clear cover described below.

The assembly of the test switch of the present invention. As is shown in FIG. 3, the first step in the assembly is to attach to each of the twenty terminals 32a to 32t on the rear of switch 20 an associated terminal clip 34a to 34t using an associated screw 36a to 36t. For ease of illustration only two terminal clips 34b and 34l and associated screws 36b and 36l are shown in FIG. 3. The reason for attaching clips 34a to 34t is that as is described below it makes it easier to wire the test switch of the present invention.

Figure 4B:
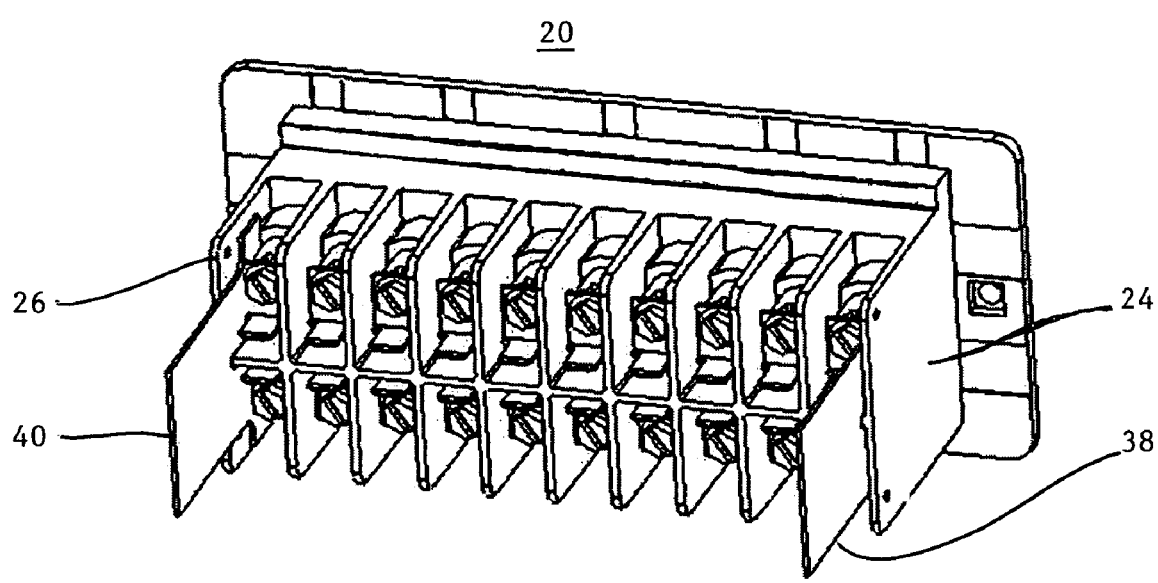

The next step in assembling the test switch of the present switch is to, as is shown in FIGS. 4a and 4b, attach to the inside of each side 24 and 26 of modified switch 20 an associated piece of insulation 38 and 40. Prior to attaching the insulation 38 and 40 a piece of two sided tape 42, 44 is as shown in FIG. 4a attached to each piece of insulation near on edge of the insulation with the backing remaining one the outwardly facing side of the tape. In one embodiment for the test switch of the present invention, each piece of tape 42, 44 is approximately 1" (about 2.54 cm) long. Each piece of insulation 38 and 40 is inserted into switch 20 such that the associated piece of two sided tape 42, 44 with the backing on faces outwardly from switch 20.

Figure 5:
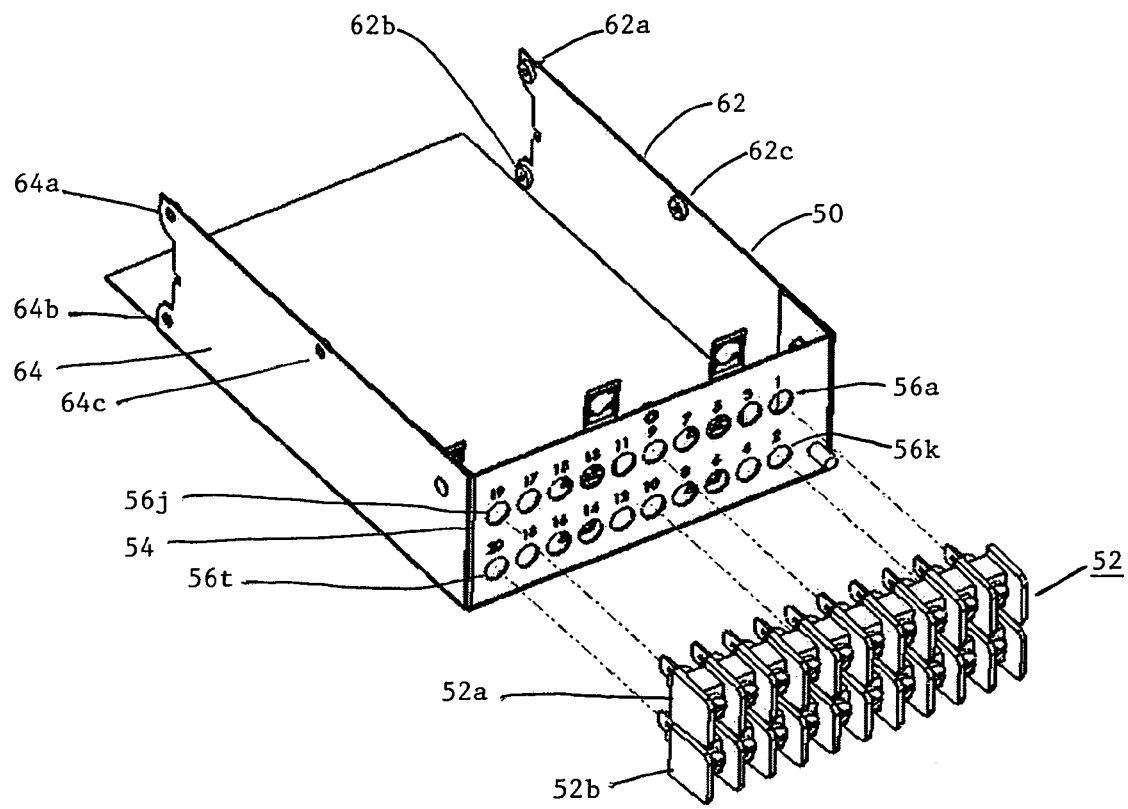
FIG. 5 shows the housing with the two identical terminal blocks to be attached to the modified test switch.
Figure 6:
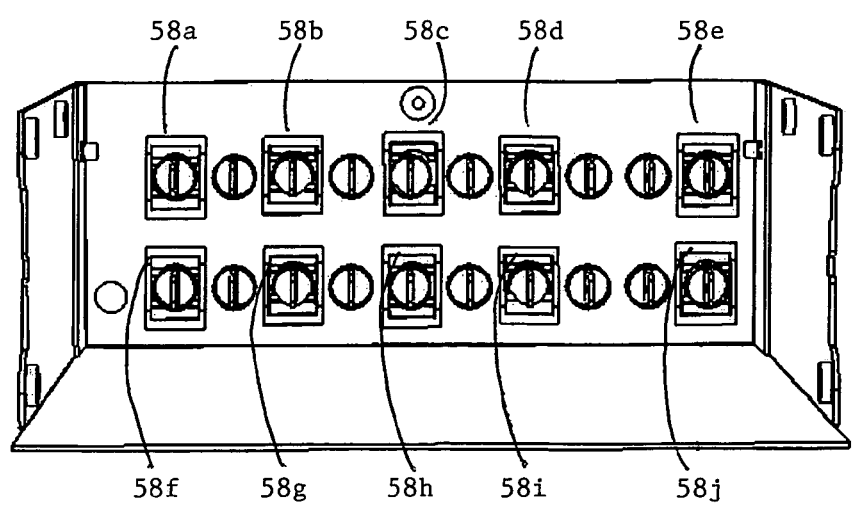
FIG. 6 shows the attachment of the two terminal blocks to the housing.

The next step in the assembly in the test switch of the present invention is to prepare the extended housing 50, shown in FIG. 5, for attachment to modified test switch 20. To that end, as is shown in FIGS. 5 and 6, a terminal block 52 which is actually two identical terminal blocks 52a and 52b is attached to the back 54 of housing 50 by inserting the blocks 52a and 52b into the associated circular openings 56a to 56t in the back 54 of housing 50. Openings 56a to 56j are associated with block 52a and openings 56k to 56t are associated with block 52b.

As is shown in FIG. 6, press fit clips 58a to 58j are used in a manner well known in the art in the inside of back 54 to hold blocks 52a and 52b in place in openings 56a to 56t. Only five clips are used with each block with clips 58a to 58e used to hold block 52a in place in openings 56a to 56j and clips 58f to 58j used to hold block 52b in place in openings 56k to 56t.

The next step in assembling the test switch of the present invention is to attach a housing 50 as assembled above to the modified test switch 20 including the insulation as described above with respect to FIGS. 4a and 4b.

Figure 7A:
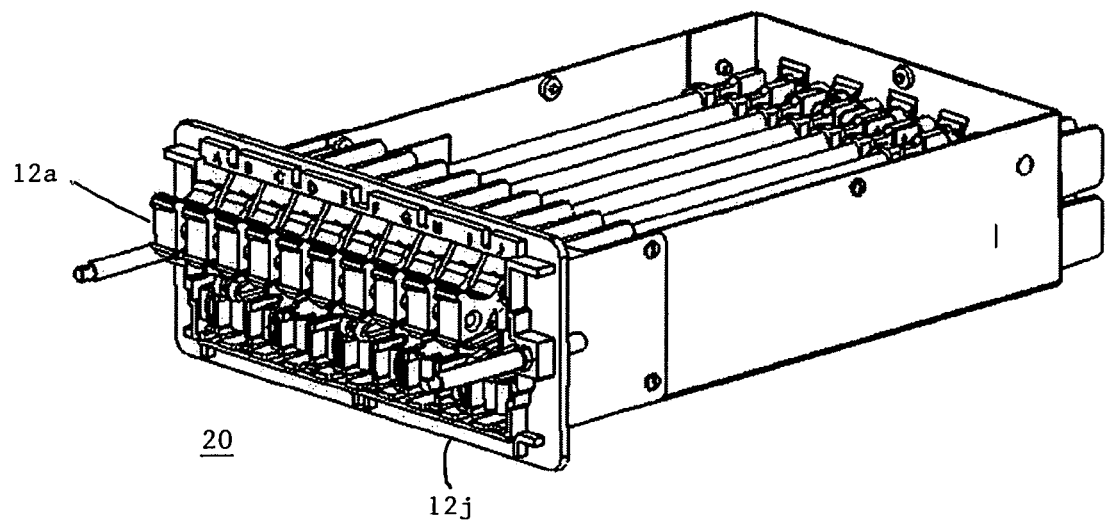
FIGS. 7a and 7b show the attachment of the assembled housing to the modified test switch.
Figure 7B:
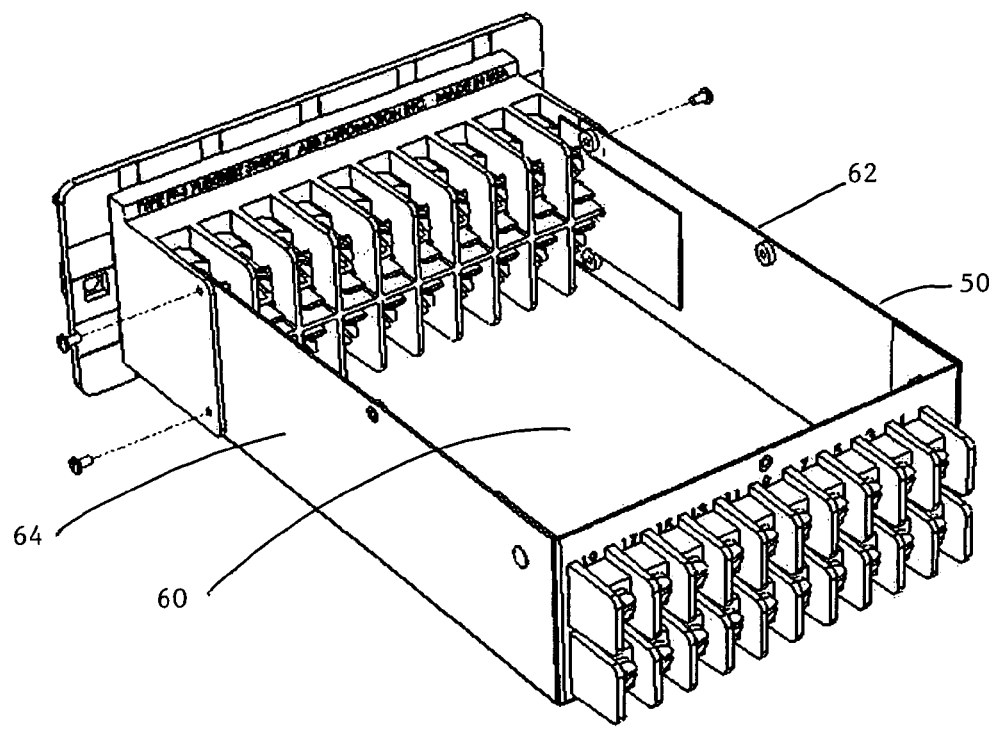

As is shown in FIGS. 7a and 7b the assembled housing 50 is attached to the test switch 20 with the switches 12a to 12j the front of the switch 20 oriented as is shown in FIG. 7a with respect to the bottom 60 of the housing. The housing 50 is attached to each side of the modified test switch by inserting screws through the two holes 62a, 62b and 64a, 64b (see FIG. 6) on each side 62 and 64 of the housing 50 that align with the holes 24a, 24b and 26a, 26b in the sides 24 and 26 of test switch 20. After the housing 50 is attached to switch 20 the backing on the outwardly facing sides of the double tape 42, 44 on insulation 38, 40, respectively, is removed and each piece of insulation is pressed against the associated side 62, 64 of housing 50.

Figure 8A:
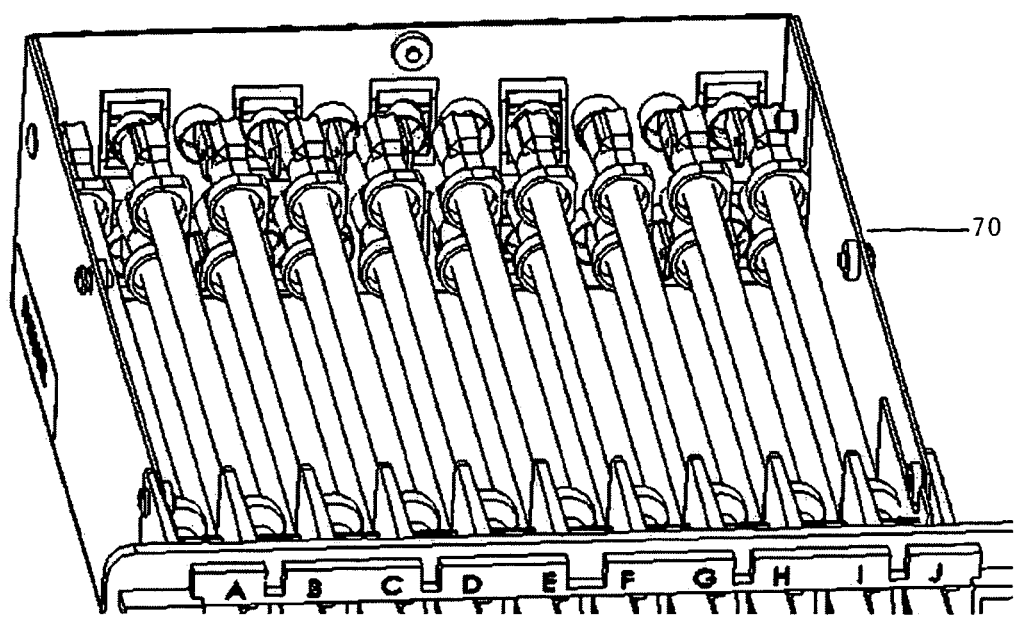
FIGS. 8a and 8b show the connection of the terminals on the rear of the modified test switch to the contacts of the two terminal blocks in the assembled housing.
Figure 8B:
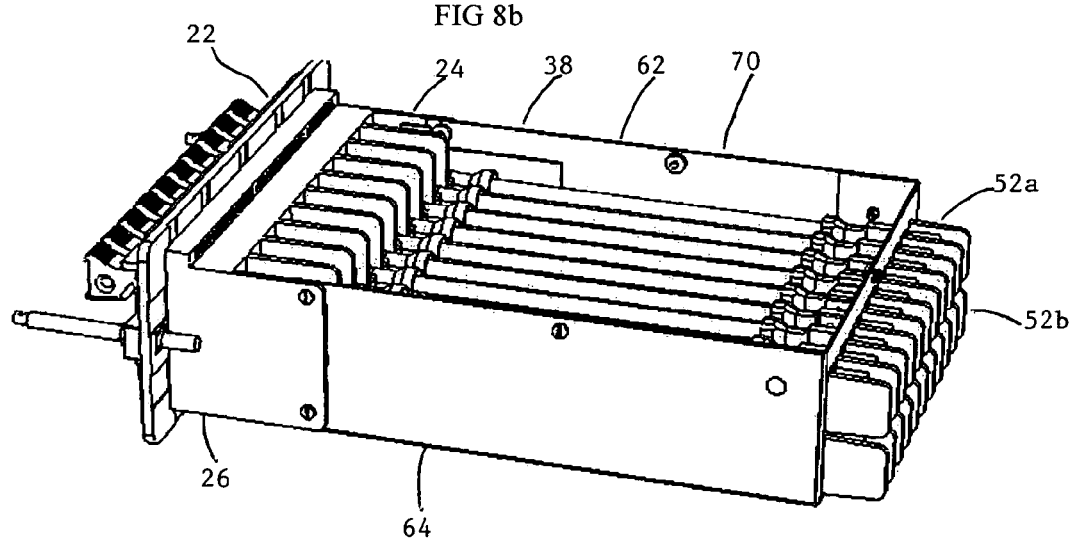
Figure 9:
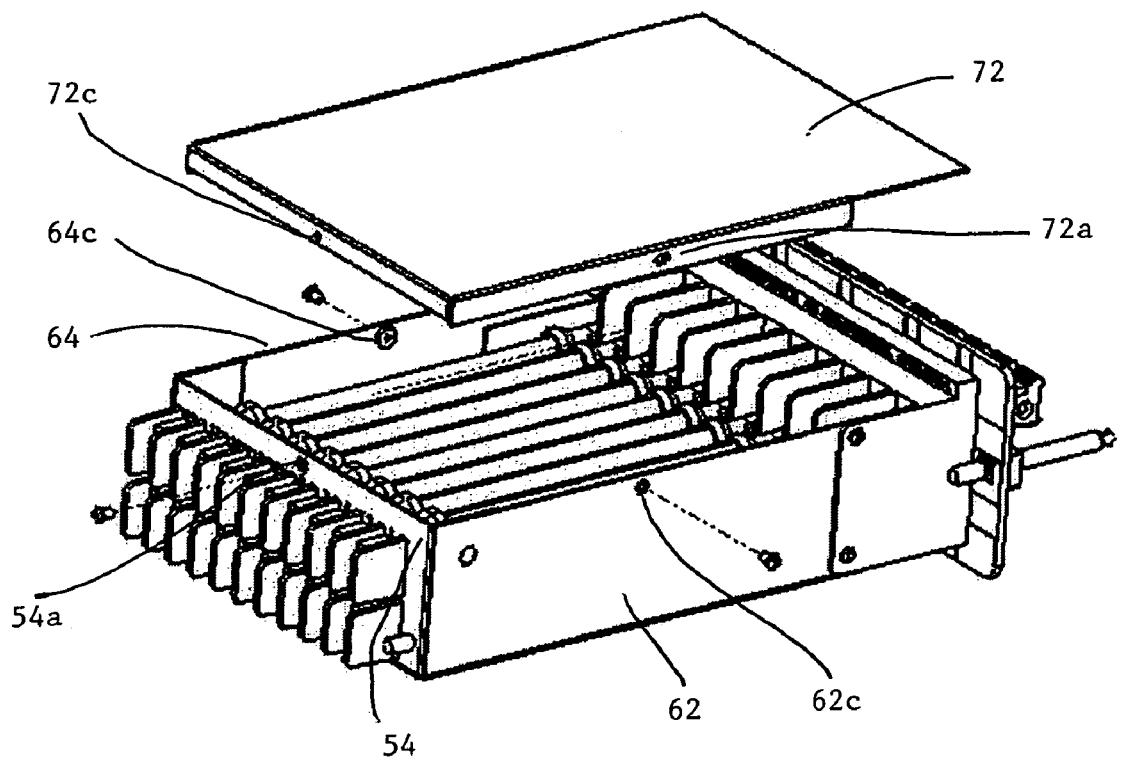
FIG. 9 shows the attachment of the top cover to the assembly of the modified test switch and the assembled housing.

The next step in assembling the test switch of the present invention is to connect by leads 70 as is shown in FIGS. 8a and 8b the terminals at the rear of the modified test switch to the associated connection point on that part of the terminal blocks 52a and 52b that faces towards the modified test switch when the housing is in assembled relationship with the modified test switch. The number of the leads 70 will depend on the application for the test switch of the present invention. Referring once again to FIGS. 4b and 6 it is seen that the terminal clips 34a to 34 on the rear of modified test switch 20 (FIG. 4b) and the terminal clips the project inwardly in housing 50 (FIG. 6) allow for easy push-on connection of leads 70 to the desired terminals. Once the leads 70 are added the housing 50 is closed as is shown in FIG. 9 by attaching top cover 72 to the housing 50 by aligning holes 72a, 72b (not shown in FIG. 9) and 72c in cover with the holes 62c and 64c on each side 62 and 64 of housing 50 and the hole 54a in back 54 of housing 50 and inserting screws in the aligned holes.

Figure 10:
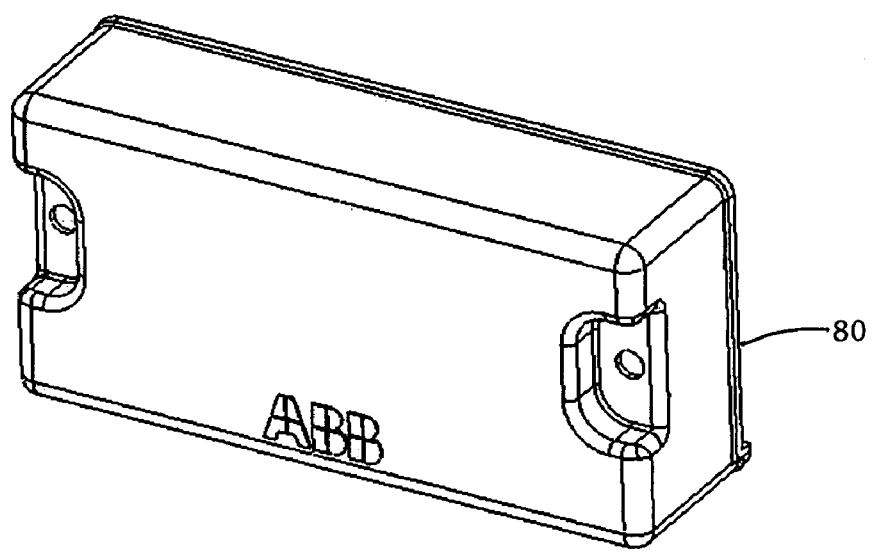
FIG. 10 shows the clear front cover for use with the test switch of the present invention.
Figure 11:
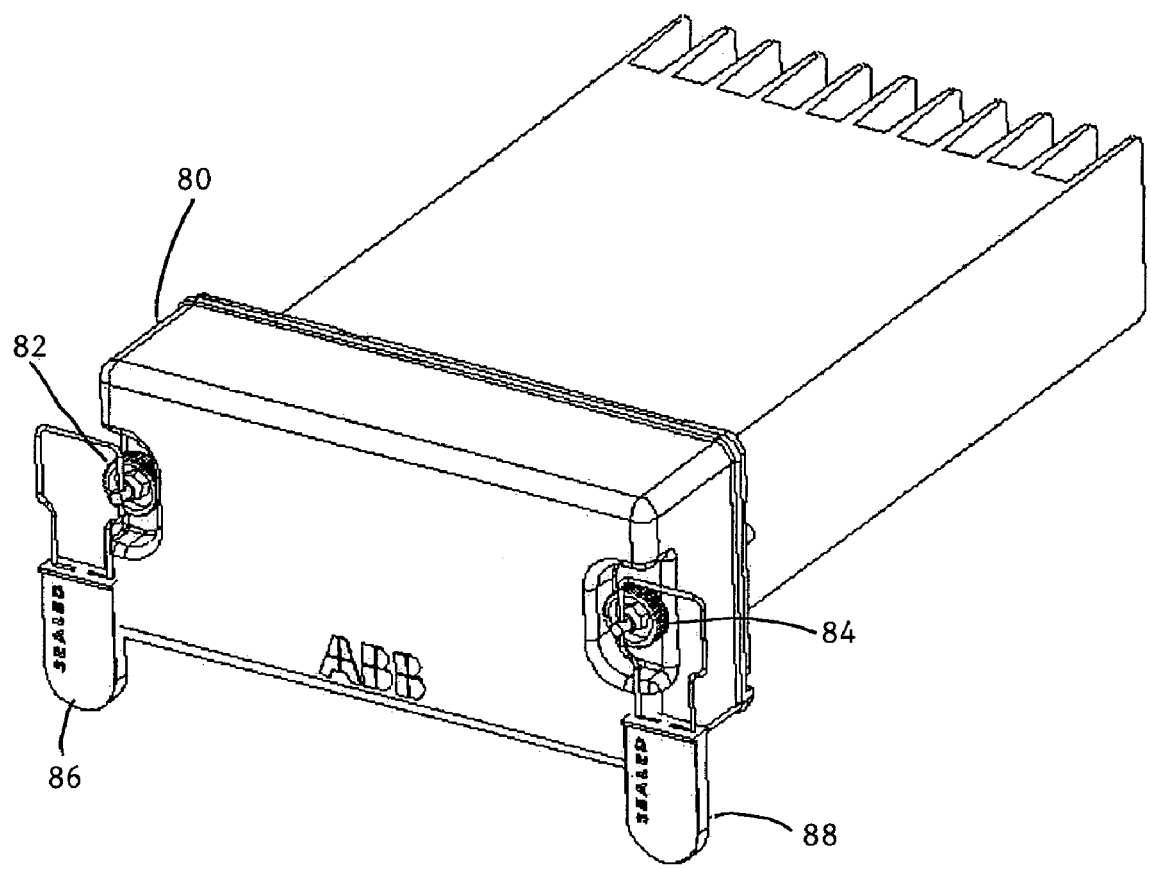
FIG. 11 shows the test switch of the present invention with the clear front cover in place and several of the switches in the open position and meter seals in place to prevent opening of the cover.

The test switch of the present invention also includes a front cover which may a solid cover (not shown) or the clear cover 80 shown in FIG. 10 which is mounted on studs 28a and 28b (see FIG. 2a) by suitable fastening hardware 82 and 84 as is shown in FIG. 11. The fastening hardware may for example be a fastener that when inserted over the associated stud 28a or 28b grips the stud in a manner well known in the art.

Opening appropriate ones of switches 12a to 12j (see FIG. 2a) on the front of the test switch of the present invention allows the user of the test switch to disconnect the associated circuits connected to those switches. Clear cover 80 has a depth which allows as is shown in FIG. 11 the clear cover to be mounted to the front of the test switch even when one or more of the switches are opened.

As is shown in FIG. 11, five of the switches are open. In that instance a meter seal 86 and 88 is looped through the opening 28c and 28d in stud 28a and 28b, respectively to prevent either inadvertent opening of the cover or illegal intrusion with one or more of the switches in an open position. As is well known to those of ordinary skill in the art meter seals 86 and 88 are seals designed to make it impossible to tamper with the seal without leaving a trace of the tampering. They are designed for a single use and cannot be accidentally opened and must be cut by a pair of pliers in order to open cover 80. Once meter seals 86 and 88 are cut they cannot be reused. Thus the test switch of the present invention allows the user to see which of the switches are in the open position while allowing the user to comply with OSHA tag and lockout procedures and other safety regulations even though one or more of the switches are open.

While not clearly shown in FIG. 5, the terminal blocks 52a and 52b have outwardly facing connection terminals which may be the same as the terminals 32a to 32t of the modified test switch 20 (see FIG. 3). It should be appreciated that in use the test switch of the present invention is usually mounted in a switchboard panel with other equipment that also has on its rear outwardly facing connection terminals.

In the test switch of the present invention the housing 50 should have a length such that when the test switch of the present invention is mounted in a switchboard panel, the connection terminals on the rear of the terminal blocks 52a and 52b are at essentially the same depth as the connection terminals on the other equipment mounted in the panel. This length for housing 50 makes it easier for a technician to connect wires to those terminals and to make those connections without risk of contacting any of the live terminals on the other equipment mounted in the panel.

The purchaser of the test switch of the present invention when ordering the test switch selects the length for housing 50 so that the test switch when installed in the panel meets the above requirement. Since most panels are designed to accommodate a predetermined one of several predetermined lengths for equipment installed in that panel, the purchaser can in its order select the housing length as one of several predetermined lengths. Alternatively the purchaser may if necessary specify the housing length.

In addition, the purchaser can when ordering the test switch of the present invention specify the types of switches 12a to 12j. The seller of the test switch of the present invention will then construct the test switch in accordance with the purchaser's requirements for housing length and type of test switches.

It should be appreciated that because the test switch of the present invention is manufactured using a modified prior art test switch, the present invention allows the manufacturer to continue to use the prior art test switch and only keep in stock housings having the several predetermined lengths.

It is to be understood that the description of the preferred embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A method of manufacturing an extended test switch comprising:
   providing a first test switch that is ready for direct connection through connection wires to electrical devices to be tested, said first test switch comprising a front face having a predetermined number of switches and a rear face having a predetermined number of terminals for receiving the connection wires;
   providing a plurality of housings, each of said housings having a different predetermined length and comprising a rear wall having a predetermined number of inwardly facing and outwardly facing terminals;
   selecting one of the housings;
   modifying said first test switch to accept said selected housing;
   connecting one of said rear face terminals of said first test switch to one of said inwardly facing terminals of said rear wall of said selected housing; and
   connecting said selected housing to said first test switch.

2. The method of claim 1 further comprising providing a translucent cover having a depth sufficient to allow said cover to be attached to said front face of said first test switch even when one or more of said switches are left in an actuated position.

3. The method of claim 1 wherein said first test switch has first and second rearwardly extending sides and said modifying of said first test switch to accept said selected housing comprises modifying said first and second rearwardly extending sides to accept said selected housing when said selected housing is connected to said first test switch.

4. The method of claim 3 further comprising attaching insulation between each of said rearwardly extending sides and said terminals on said rear face of said first test switch.

5. The method of claim 1 further comprising attaching a cover to said front face of said first test switch after said selected housing is connected to said first test switch.

6. The method of claim 5 wherein said cover is translucent.

7. The method of claim 1 wherein said selected housing has an open top and said method further comprises closing said open top after said selected housing is connected to said first test switch.

8. The method of claim 1 wherein said providing a plurality of housings comprises manufacturing each of said housings by attaching said predetermined number of inwardly facing and outwardly facing terminals to a housing that is devoid of such terminals.

9. The method of claim 1 further comprising adding a clip to at least one of said rear face terminals of said first test switch.

* * * * *